United States Patent
Evans et al.

[11] Patent Number: 6,050,326
[45] Date of Patent: Apr. 18, 2000

[54] METHOD AND APPARATUS FOR COOLING AN ELECTRONIC DEVICE

[75] Inventors: Richard J. Evans, Underhill; David L. Gardell, Fairfax; Anthony M. Palagonia, Underhill, all of Vt.

[73] Assignee: International Business Machines Corporation, Armonk, N.Y.

[21] Appl. No.: 09/076,270

[22] Filed: May 12, 1998

[51] Int. Cl.[7] .............................. F28F 5/00; H05K 7/20
[52] U.S. Cl. ........................... 165/80.2; 165/86; 165/185; 361/704
[58] Field of Search ........................... 165/80.2, 86, 185; 361/704, 714, 715

[56] References Cited

U.S. PATENT DOCUMENTS

| | | |
|---|---|---|
| 4,144,932 | 3/1979 | Voight . |
| 4,235,283 | 11/1980 | Gupta . |
| 4,603,243 | 7/1986 | Septfons et al. ...................... 165/86 X |
| 4,880,049 | 11/1989 | Jaeger .................................. 165/86 X |
| 4,986,346 | 1/1991 | Blackmon et al. ....................... 165/86 |
| 5,092,241 | 3/1992 | Feser et al. ........................... 165/86 X |
| 5,119,142 | 6/1992 | Swapceinski et al. ................ 165/86 X |
| 5,288,203 | 2/1994 | Thomas . |
| 5,335,143 | 8/1994 | Maling, Jr. et al. . |
| 5,424,914 | 6/1995 | Smith et al. . |
| 5,504,924 | 4/1996 | Ohashi et al. . |
| 5,562,089 | 10/1996 | Astle, Jr. . |
| 5,609,202 | 3/1997 | Anderson et al. . |
| 5,615,085 | 3/1997 | Wakabayashi et al. . |

OTHER PUBLICATIONS

White, K. Alan, "Moving Belt Radiator Development Status", NASA Technical Memorandum 100909, Jul. 1988.
"Circuit Chip Packaging Using Egg Crate", C.F. Close and J.P. Moreschi, IBM Technical Disclosure Bulletin, vol. 8, No. 11, Apr. 1966.

*Primary Examiner*—Leonard Leo
*Attorney, Agent, or Firm*—Robert A. Walsh

[57] ABSTRACT

A heat dissipation apparatus for cooling one or more electronic devices. The apparatus utilizes a moving heat sink a portion of which is in contact with the device to be cooled. The moving heat sink may be in the form of a rotating disk, moving belt or strip. The heat sink may be made from various materials such as metals or plastics.

24 Claims, 10 Drawing Sheets

METHOD AND APPARATUS FOR COOLING AN ELECTRONIC DEVICE

FIELD OF THE INVENTION

The present invention relates to the field of cooling of electronic components; more specifically, it relates to an apparatus and a method for enhancing the removal rate of heat generated by electronic components.

BACKGROUND OF THE INVENTION

High performance microprocessor devices and the like concentrate heat in a very small space which require improved thermal cooling to maintain acceptable operating conditions. There are numerous different solutions to overcome this problem which are used in different applications such as thermally conductive pistons, micro bellows, water cooled cold plates, heat sinks, heat pipes and fans. A conventional technique used to improve thermal performance is to add finned heat sinks to increase the available surface area. Making the fins longer provides increasing thermal performance up to a point. If the fins get too long, the tips of the fins approach ambient temperature and an increase in fin length no longer improves the thermal performance. The dominate heat transfer mechanism then becomes a combination of conduction within the fin, which requires thicker or higher conductivity fins and convection from the fins to the air. Another conventional method to improve thermal performance is by improving air flow. The ultimate performance of an air cooled heat sink will be limited by available space, air flow and weight. The following patents have addressed various aspects of this problem.

U.S. Pat. No. 4,235,283 to Omkarnath teaches a thermal conduction module for cooling one or more chips via a spring loaded piston having one end in contact with the chip and the other end sliding in a hole in a massive water cooled block. Extremely good thermal performance is obtained but the system is massive and not applicable to standard semiconductor packaging techniques.

U.S. Pat. No. 5,609,202 to Anderson et. al, describes a method of improving a finned heat sink by addition of a fan within a cavity formed in the fined portion of the heat sink. This device is large and the fan tends to generate loud audible noise.

U.S. Pat. No. 5,504,924 to Ohashi et. al. utilizes a heat pipe as one of its components, but to make the heat pipe effective one end is attached to a large cooling unit which is quite cumbersome.

U.S. Pat. No. 5,335,143 to Maling et. al. describes a turbine system with spinning fins interlaced with stationary fins. This arrangement increases the mass transfer of air thereby drawing the heat from the components. The entire unit is mounted to the component or the electronic devices are mounted on the stationary fins. Relatively high speeds are required and the unit is far too large for dense, lightweight, low power applications needed for semiconductor chips.

Thus high performance cooling methods can be quite large, heavy, or consume large amounts of power or generate audible noise which are undesirable in small equipment or portable computers.

SUMMARY OF THE INVENTION

It is an object of the present invention to provide cooling for an electronic device using a large surface area heat sink fin that is contact with and moving relative to the electronic device. The predominate heat transfer mechanism becomes conduction and because the heat sink is moving convection transfer also occurs.

It is a further object of the invention that the heat transfer be accomplished using a rotating disk.

It is a further object of the invention that the heat transfer be accomplished using a rotating continuous belt.

It is a further object of the invention that the heat transfer be accomplished using a reciprocating strip.

It is a still further object of the present invention that the heat transfer efficiency be nearly independent of fin thickness and thermal conductivity as long as sufficient fin velocity relative to the electronic component is maintained. The fin can therefore be made of lightweight plastic materials.

It is another object of the invention to provide high thermal transfer with low velocity airflow in a limited amount of space.

Since one or more electronic devices can be put in contact with the same moving heat heat sink all devices will be brought to the same temperature, therefore it is an object of the invention to provide a method of maintaining a group of electronic devices at the same temperature.

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1A:
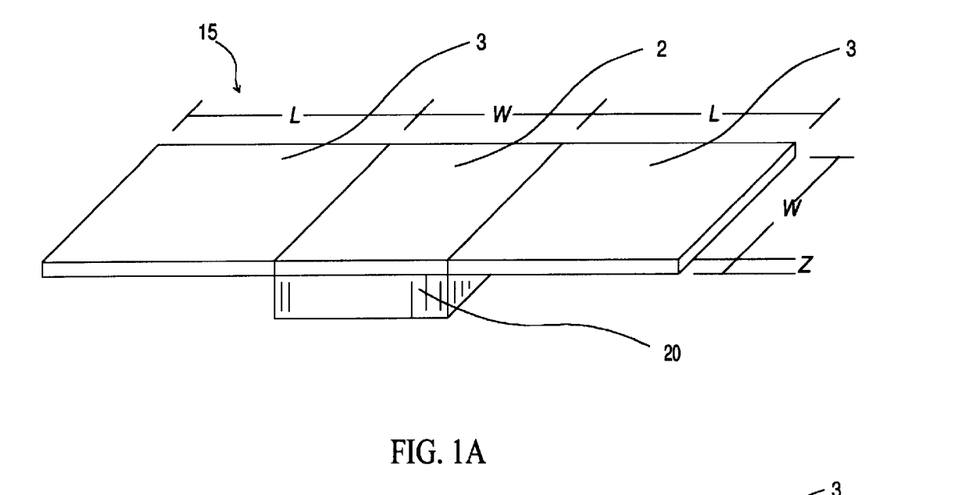
FIG. 1A is a isometric view of a double finned heat sink.

The advantage of the current invention can be realized by comparing its thermal performance to a conventional finned air colled electronic module heatsink. It will be immediately recognized by one skilled in the art that the invention is equally applicable to use with other heat transfer fluids such as liquids and gasses, other thermal control problems in other industries. The predominate heat transfer mechanism does not need to be limited to convection and could include contact and radiation heat transfer from the moving fin. Attention is directed to FIG. 1A heat sink 15 which is in contact with an electronic module 20, the heat sink has a square isothermal base 2 of dimension "w" which is typically about the same size as the electronic devices, such as semiconductor modules. Space above the module is limited so fins 3 are added to opposite edges of the base. The thermal performance of this heat sink can be estimated by making some simplifying assumptions. There are two fins 3 of width "w," length "l" and thickness "z" with thermal conductivity "k" attached to opposite sides the isothermal heat sink base 2 at temperature "$T_b$." A uniform convective heat transfer coefficient "h" and ambient air temperature "$T_a$," is assumed for the top surface of the base 2 and the top and bottom surfaces of fins 3. The total heat dissipated by the heat sink is "Q." The thermal resistance "Rt" of the heat sink is defined by:

$$R_t = \frac{T_b - T_a}{Q}$$

The total thermal resistance of the heat sink is calculated by adding the resistance of the base "$R_b$," in parallel to the resistance of the two fins "$R_f$."

$$R_t = \frac{R_f R_b}{R_f + 2R_b}$$

where $$R_b = \frac{1}{hw^2}$$

and from the classical one dimensional fin equation:

$$R = \frac{1}{w\sqrt{2hkz}\,\tanh(ml)}$$

where $$m = \sqrt{\frac{2h}{kz}}$$

Figure 2:
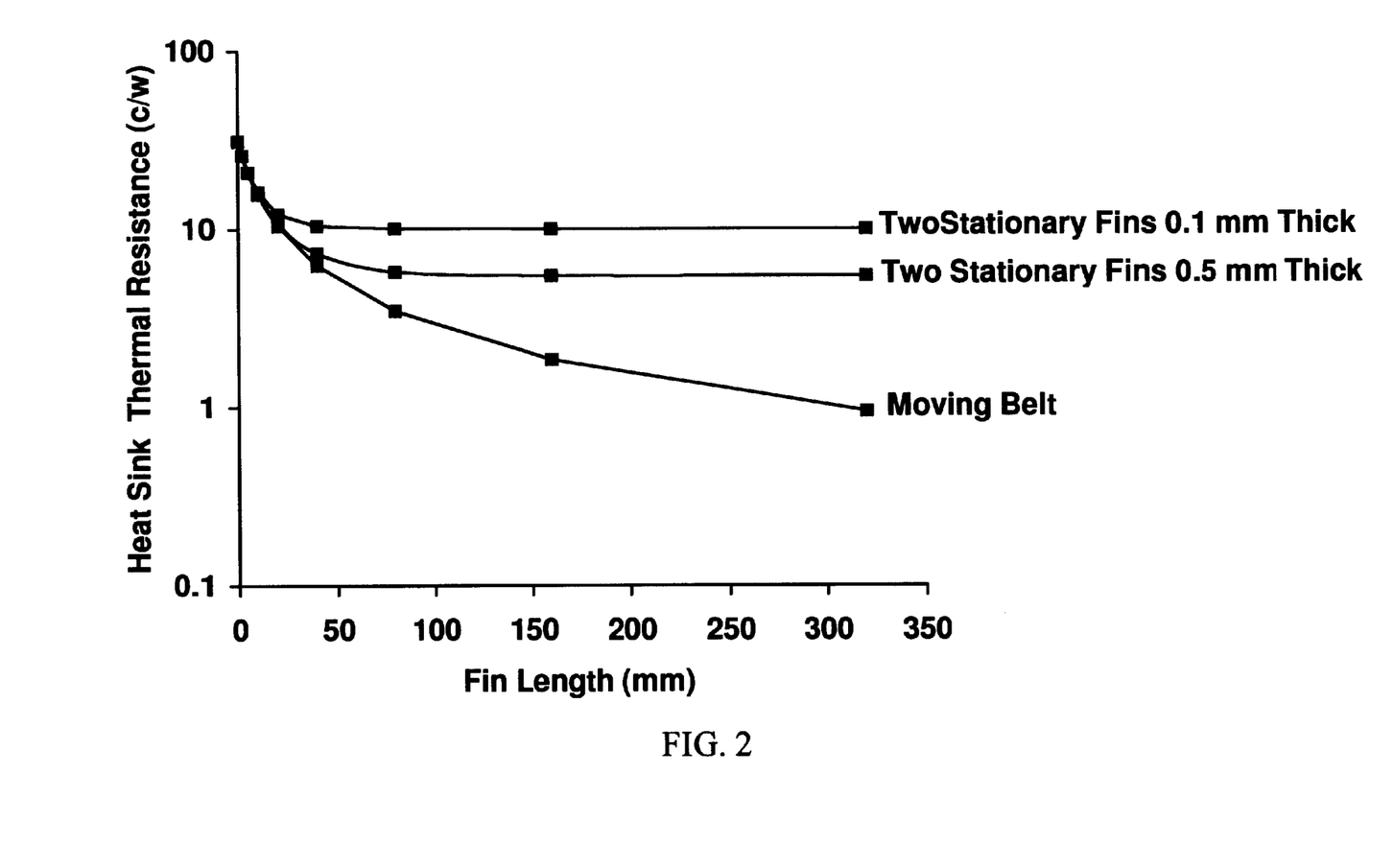
FIG. 2 is a graph relating thermal resistance to fin length.

In FIG. 2 the total thermal resistance "$R_t$," is plotted vs. fin length "z" for different fin thickness assuming w=40 mm, h=2e$^{-5}$ w/sq. mm ° C. and for an aluminum heat sink k=0.177 w/mm ° C.

Figure 1B:
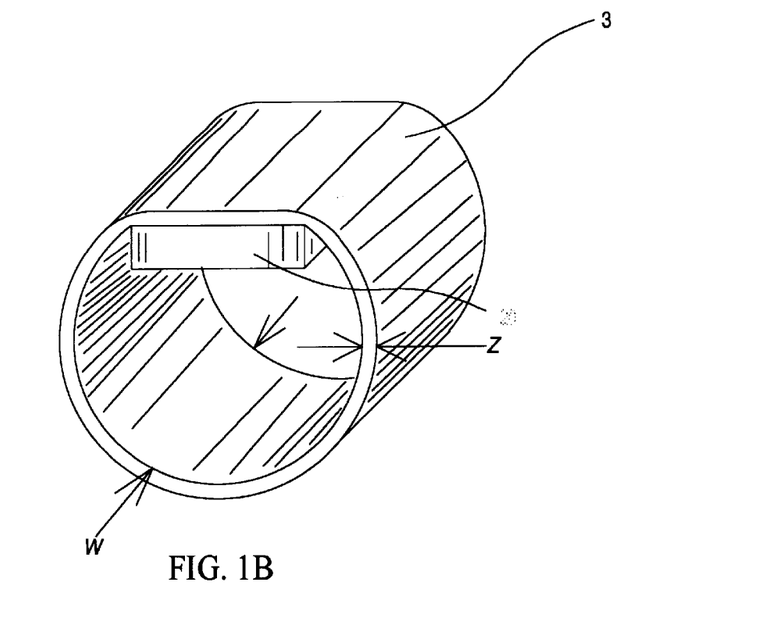
FIG. 1B is a isometric view of a moving heat sink according to the present invention.

FIG. 1B illustrates a design model of the present invention wherein the two fins 3 of FIG. 1A have been bent into a loop. This loop can rotate around the module 20. The thermal resistance of this moving loop "R" or belt is:

$$R = \frac{T_b - T_a}{Q}$$

where "$T_b$," is the temperature of the belt above the middle of module 20. Assuming the belt is moving at sufficient speed so that the entire belt is significantly above the ambient air temperature "$T_a$," then the average belt temperature is approximately the same as "$T_b$." The simplifies the calculation of thermal resistance "R" as:

$$R = \frac{1}{hA}$$

where A is the total exposed surface area of the belt.

Thermal resistance of a moving belt which has the same exposed surface area as the stationary fins is plotted in FIG. 2. The graph demonstrates the limitations of conventional finned heatsinks. It is noted that thermal resistance is reduced by increasing fin length but there is a limit beyond which further increases in length have little effect. Further improvements with conventional fins equire that the fins be thicker or made out of a material that has a higher thermal conductivity to improve the conduction transport of heat along the fin length. The thicker fin in FIG. 2 has improved ultimate thermal performance at the cost of increased weight. Fin thermal conductivity and fin thickness have essentially the same effect on thermal resistance. This is the reason conventional air cooled heatsinks are constructed from materials that have fairly high thermal conductivity such as Aluminum (k=177 W/m° C.). Other metals and high thermal conductivity composite materials have also been proposed for air cooled heatsinks (k>about 50 W/m° C.).

The current invention does not suffer from this limitation because the heat is transported by the moving belt. Thermal conductivity of the belt material is not a significant factor in its performance. Material with thermal conductivities under 50 W/m C are thus quite useable. More significantly, unconventional heatsink materials such as plastics that have a thermal conductivity less than 1 W/m C are suitable.

It can be seen that the moving belt avoids the problem of decreasing cooling effect as fin length is increased. It also effectively moves the heat transfer surface away from the module which is advantageous for the case where space near the module is limited.

Belt speeds below some optimum level will result in large variations in belt temperature and thus reduced heat transfer performance. As a first order approximation the optimum belt speed will be directly proportional to "h" and inversely proportional to the specific heat of the belt per unit surface area. Also note that thermal performance is relatively independent of the belt thermal conductivity, so some nontraditional materials like plastics can be used.

Thermal performance of the moving belt will be dependent on its size, thickness, specific heat, rotational speed and convective heat transfer coefficient. Therefore a very large number of combinations of these variables will produce acceptable results. They can be picked based on the specific application. Additionally rotation speed can be sped up or slowed down or turned off based on the cooling requirements of the module. It is understood that the discussion above for a belt is given as an example only to any configuration which would permit a portion of the heat sink or heat transfer element to move relative to an electronic device having an outer surface. The efficiency of the heat transfer will be increased if the heat transfer element is in close proximity or in contact with the device.

Figure 3:
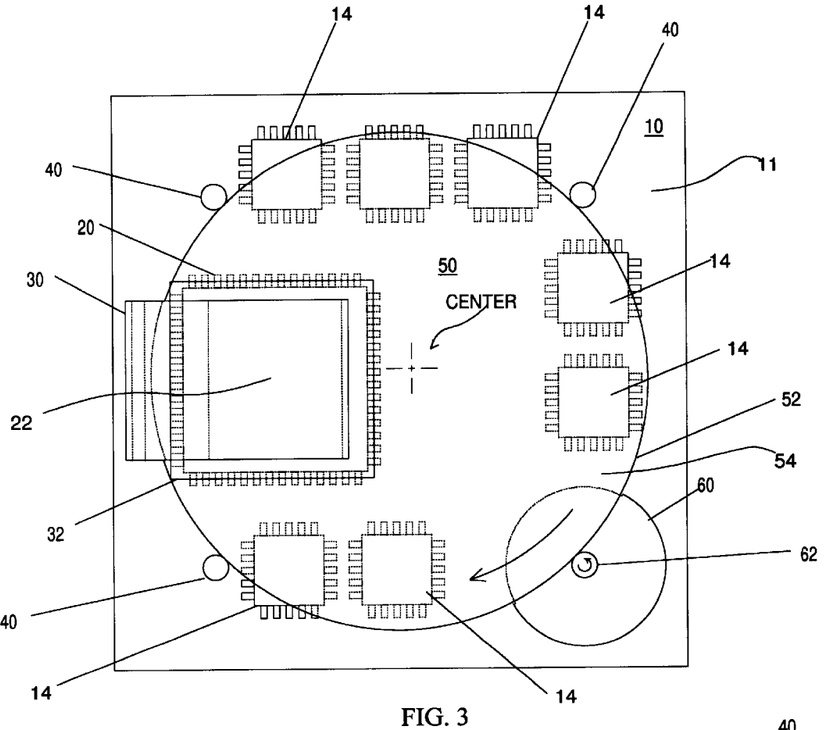
FIG. 3 is a top view of an implementation of a rotating disk system in accordance with the present invention.
Figure 4:
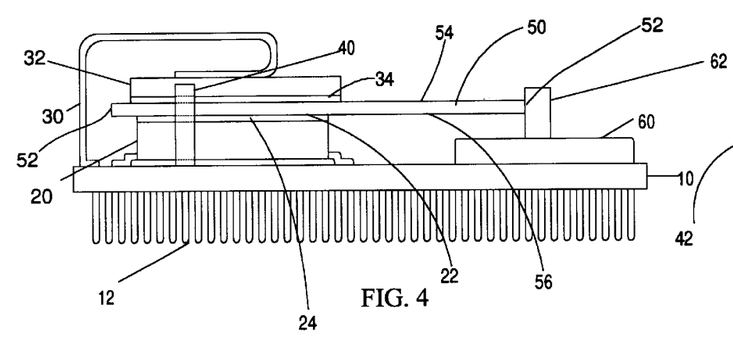
FIG. 4 is a side view of an implementation of a rotating disk system shown in FIG. 3.

In a first embodiment of the invention the moving heat sink comprises a rotatable disk system which is illustrated in FIGS. 3 and 4. FIG. 3 is a top view and FIG. 4 is a side view of an electronic circuit board 10 having a module 20 mounted onto the top surface 11 of the circuit board 10. Module 20 contains a device such as a micro processor that produces large amounts of heat. In slipping contact with the top surface 22 of module 20 is the bottom surface 56 of disk 50. Disk 50 is rotatably mounted about its center and made of a material having heat transfer properties such as a metal such as aluminum or a non conductive material such as plastic. The center of disk 50 is offset from the center of the module 20. The disk is held in horizontal position by guide pins 40 contacting edge 52 of disk 50 and rotated about its center by drive pin 62 driven by a motorized drive such as a pancake motor 60 which contacts edge 52 of disk 50.

Figure 4A:
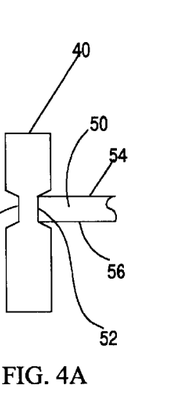
FIG. 4A is a detail of a guide pin shown in FIG. 4.

As shown in FIG. 4A, a notch 42 in drive pins 40 engages edge 52 of disk 50. Disk 50 has a top surface 54 in slideable contact with pressure plate 32 and a bottom surface 56 in loose contact with the top surface 22 of module 20. Spring clip 30 applies pressure to pressure plate 32. The purpose of the pressure plate is to maximize the surface of the disk in contact with the top of the module. Optional slip surface 34 on the pressure plate 32 and optional slip surface 24 on the top 22 of module 20 are shown. This slip surface may be a nylon or Teflon coating or the like. Motor 60 engages edge 52 of disk 50 to rotate disk 50, but could be mounted coaxially with the disk center. The arrangement shown has the advantage of a smaller resulting footprint and lower height of the total assembly and keeps the motor a far as possible from module 20 to facilitate electronic shielding. Also shown are other electronic support modules 14 mounted on the top surface 11 of board 10 in the space between the bottom 56 of disk 50 and the top surface 11 of board 10. Board 10 has pins 12 for mounting to the next level of assembly. These could be equally as well solder bumps or edge connectors. The board may be comprised of organic or ceramic material and be single or multilevel.

Figures 5, 6:
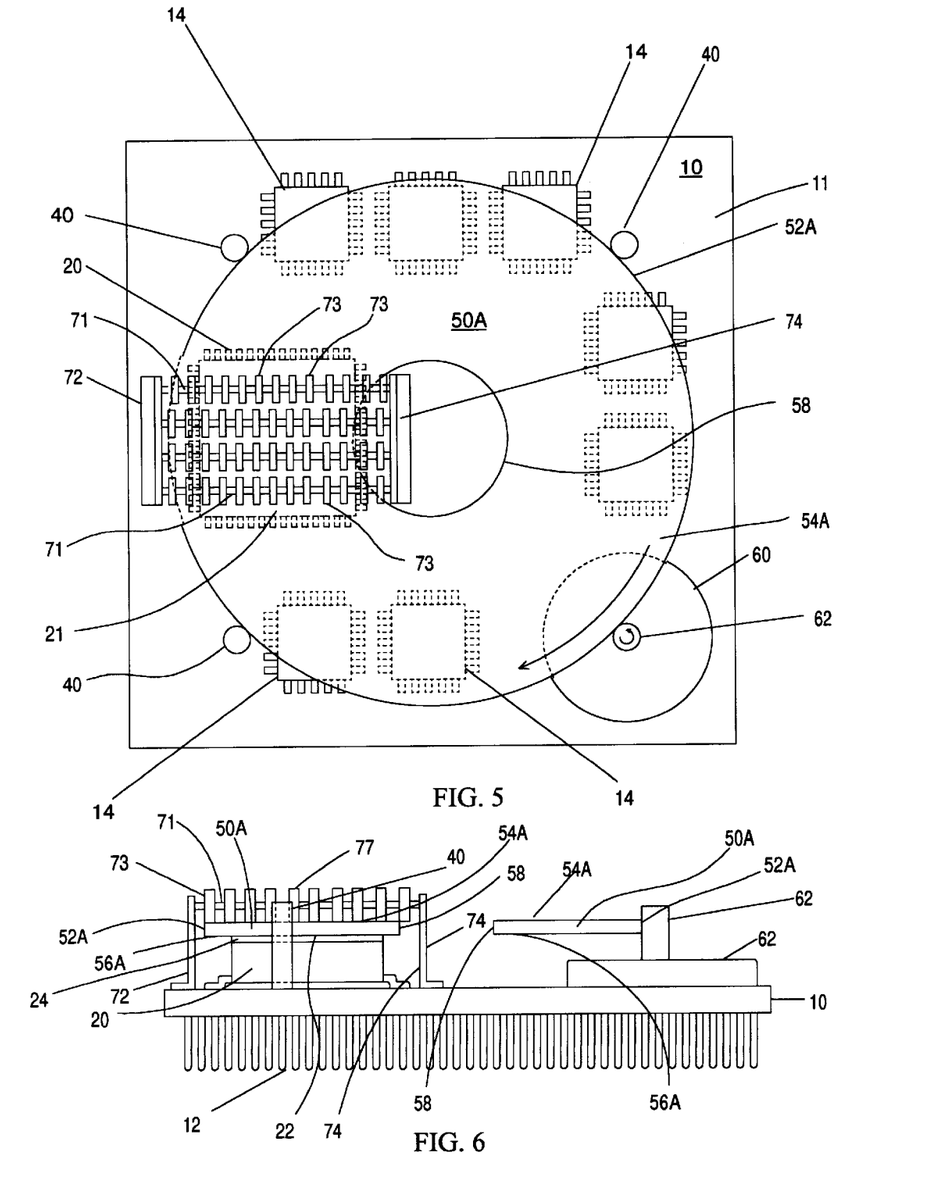
FIG. 5 is a top view of another embodiment of the rotating disk system in accordance with the present invention.
FIG. 6 is a side view of the rotating disk system.

Attention is now directed to FIGS. 5 and 6 which illustrate an alternative method of keeping the disk in contact with a module to be cooled. Bottom surface 56A of disk 50A is kept in contact with the top 22 of module 20 is by means of a set of disks 73 free to turn independently on shafts 71 supported by inner bracket 74 and outer bracket 72. Outer surface 76 of rollers 70 bear on top surface 54A of disk 50A. An inner circular opening in disk 50A is defined by inner edge 58. This allows mounting of inner bracket 74 to board 10. The roller 70 may be made of resilient material such as plastic or rubber.

Figure 7:
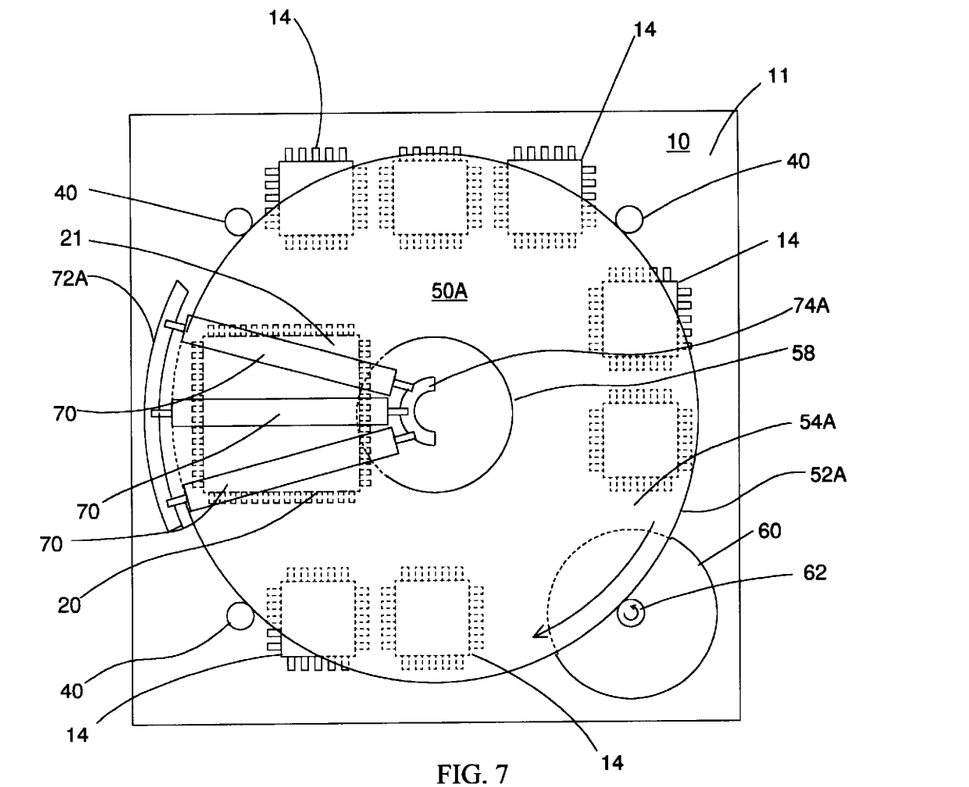
FIG. 7 is a top view of another embodiment of the rotating disk system in accordance with the present invention.
Figure 8:
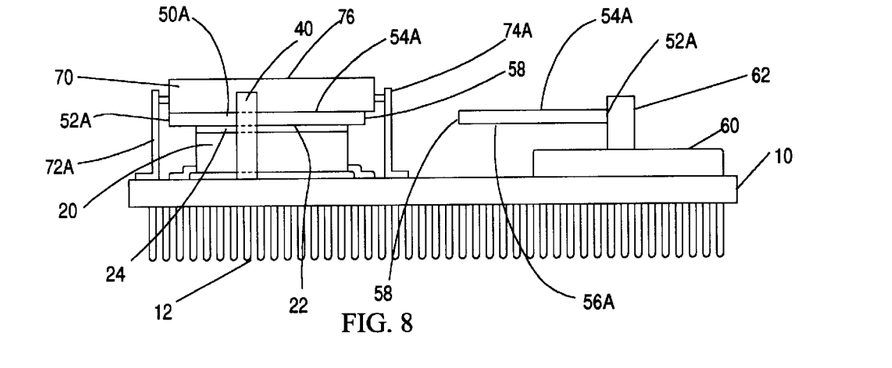
FIG. 8 is a side view of a rotating disk system shown in FIG. 7.

FIGS. 7 and 8 illustrate another arrangement to selectively apply pressure onto the module 70, Rollers 70 are mounted between inner bracket 74A and outer bracket 72A such that the longitudinal axis of each roller 70 aligns with a radii emanating from the center of disk 50A. This does not require any slipping of the rollers and higher pressures are possible. In this configuration it would be possible to replace drive motor 60 and drive pin 62 with another guide pin and place a small motor to drive one of rollers 70 to turn the disk.

Figure 9:
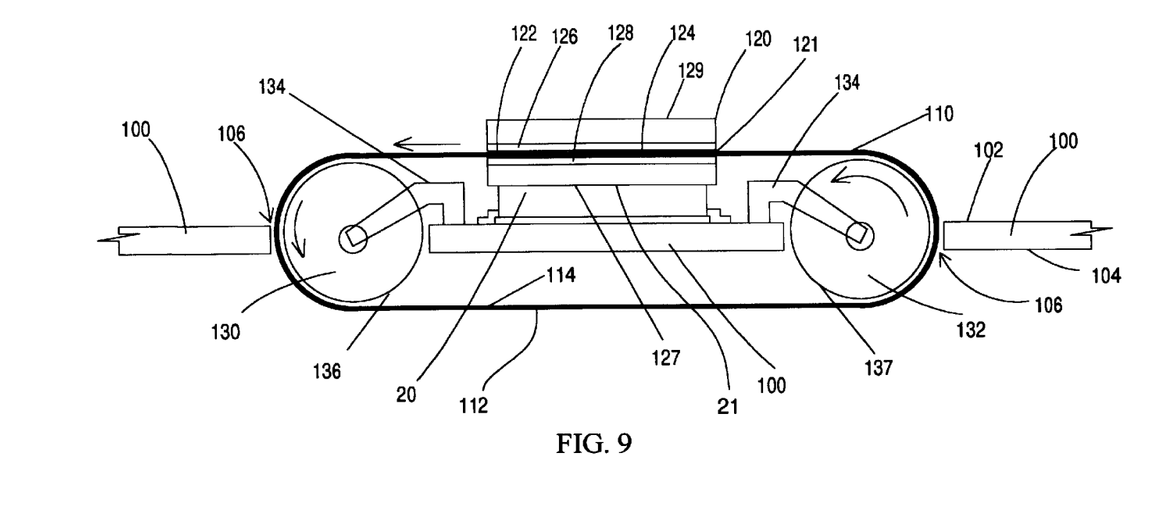
FIG. 9 is a side view of a continuous belt system in accordance with the present invention.
Figure 9A:
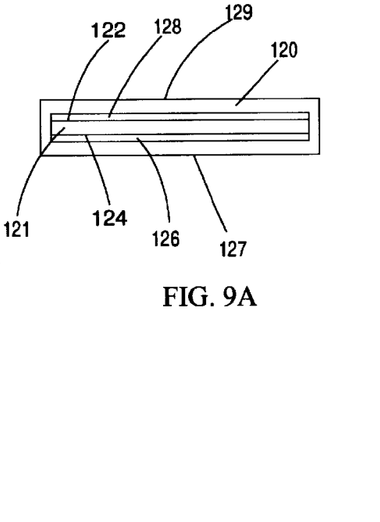
FIG. 9A is an end view of the belt guide shown in FIG. 9.

In another embodiment of the present invention the moving heat sink comprises a continuous moving belt. FIG. 9 illustrates module 20 is mounted to the top surface 102 of board 100. A moving belt 110 is driven through slot 121 in guide plate 120. The slot has an upper surface 122 and a lower surface 124. The bottom surface 127 of guide plate 120 is in thermal contact or integral with the top surface 21 of module 20. The guide plate may be made of a metal such as aluminum or some other material having heat transfer properties. Belt 110 passes through slot 121 in guide plate 120 and is supported by drive roller 130 on one side of module 20 and supported at the opposite side by idler roller 132. Belt 110 has an inside surface 114 contacting outer surface 136 of drive roller 130 and outside surface 137 of idler roller 132. Motion is imparted to drive roller 130 directly by a conventional motor or by an external drive means such as belts or shafts coupled to a remote motor, not shown. Belt 110 should be kept in tension and have a frictional fit against rollers 130 and 132. Roller surfaces 136 and 137 preferably have a resilient surface such as rubber or high density foam plastic. Rollers 130 and 132 are supported by brackets 134. Rollers 130 and 132 extend below board 10 through openings 106. In such an arrangement the belt 110 travels over and under board 100. Brackets 134 are adjusted such that the outer surface 136 and 137 of rollers 130 and 134 are lower than lower surface 124 of slot 121 in guide plate 120 thus keeping belt 110 in good contact with the lower surface 124 of slot 121 of guide plate 120. By adjusting the width of slot 121 in guide plate 120 it is possible to keep outer surface 112 of belt 110 in contact with upper surface 124 of slot 121 in guide plate 120. The belt may made from flexible material such as stainless steel, brass, plastic or rubber provided the softening temperature of the material is not exceeded. FIG. 9A shows an end view of guide plate 120 of FIG. 9 that illustrates an optional slip surface 126 on the bottom surface 124 of guide plate 120 and optional slip surface 128 on the top surface 122 of guide plate 120. This slip surface may be a nylon or Teflon coating or a separate insert.

Figure 10:
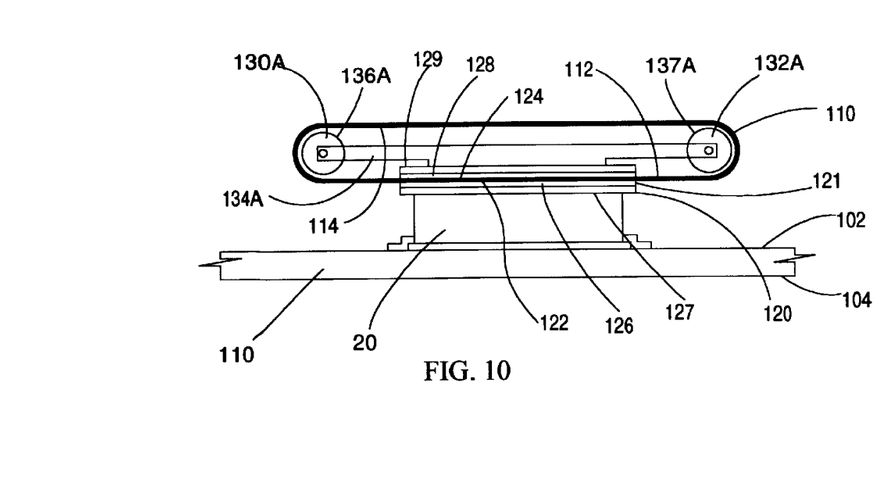
FIG. 10 is a side view of another embodiment of the continuous belt system in accordance with the present invention.

FIG. 10 illustrates an alternative method of mounting a belt cooling device to a module particularly suited for retrofit of existing micro-processors and PC mother board designs. Guide plate 120 is mounted to the top of module 20. The bottom surface 127 of guide plate 120 is in thermal contact with the top surface 21 of module 20. Bracket 134A which supports drive roller 130A and idler roller 132A is mounted to top surface 129 of guide plate 120. Rollers 130A and 132 should be adjusted so surfaces 136A and 137A are lower than bottom surface 124 of guide plate 120 thus keeping outer surface 112 of belt 110 in slideable contact with bottom surface 124 of guide plate 120. By adjusting the width of slot 121 in guide plate 120 it is possible to keep inner surface 114 of belt 110 in contact with upper surface 122 of slot 121 in guide plate 120.

Figure 11:
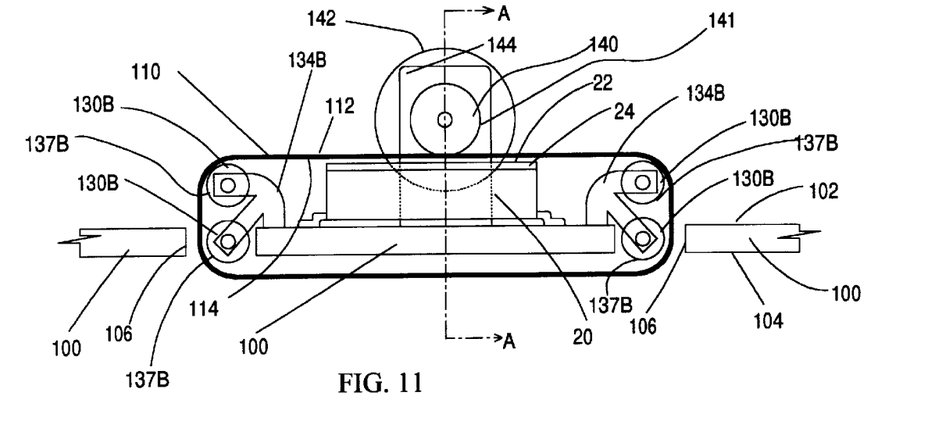
FIG. 11 is a side view of another embodiment of the continuous belt system in accordance with the present invention.
Figure 12:
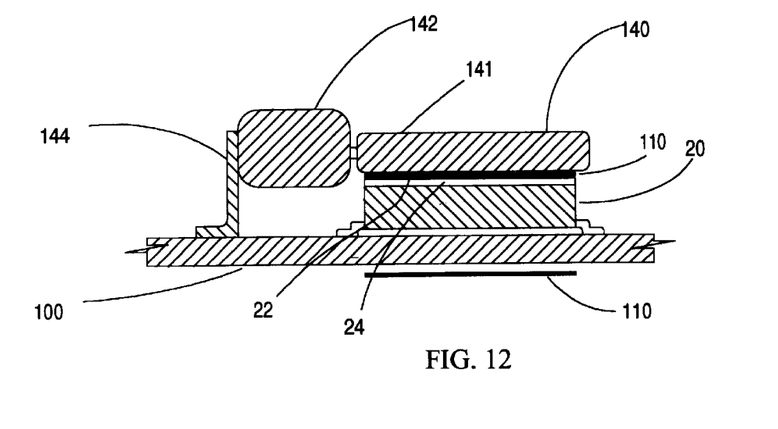
FIG. 12 is a section view through AA of FIG. 11.

FIG. 11 illustrates another alternative to positioning the guide plate and drive mechanism shown in FIG. 9 wherein drive roller 140 presses belt 110 against the top surface 22 of module 20. As drive roller 140 rotates linear motion is imparted to belt 110. Motor 142 mounted to board 110 by bracket 144 rotates drive roller 140. Idler wheels 130B attached to brackets 134B which are attached to board 100 guide the belt over the top surface 22 of module 20 through openings 106 and under board 100. FIG. 12 is a sectional view of FIG. 11 through line AA. Optional slip surface 24 on the top surface 22 of module 20 is shown. This slip surface may be a nylon or Teflon coating or a separate insert.

Figure 13:
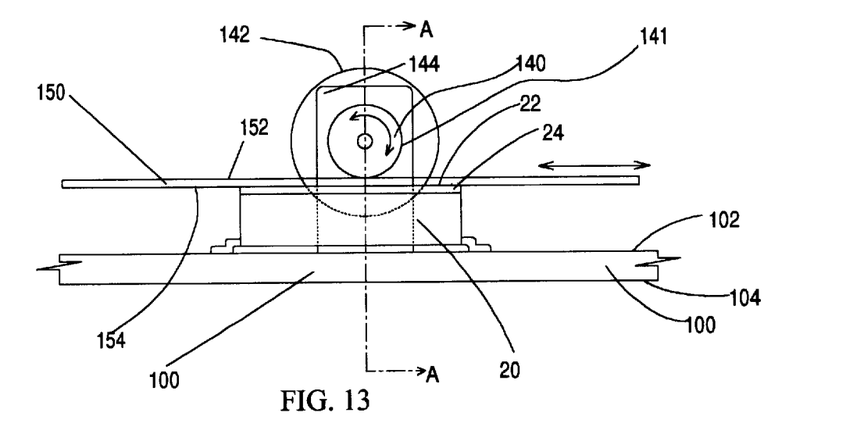
FIG. 13 is a side view of a reciprocating strip system in accordance with the present invention.
Figure 14:
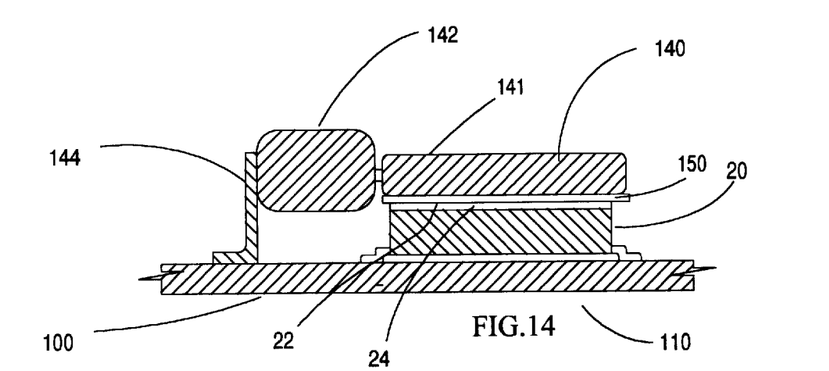
FIG. 14 is a section view through AA of FIG. 13.

FIGS. 13 and 14 illustrate another alternative where the bottom surface 154 of strip 150 is pressed against top surface 22 of module 20 by means surface 141 of roller 140 pressing against surface 152 of strip 150 which also imparts transitional motion to strip 150. However the direction of roller 140 is made to change so strip 150 exhibits reciprocating back and forth motion as shown by arrows relative to module 20.

Figure 15:
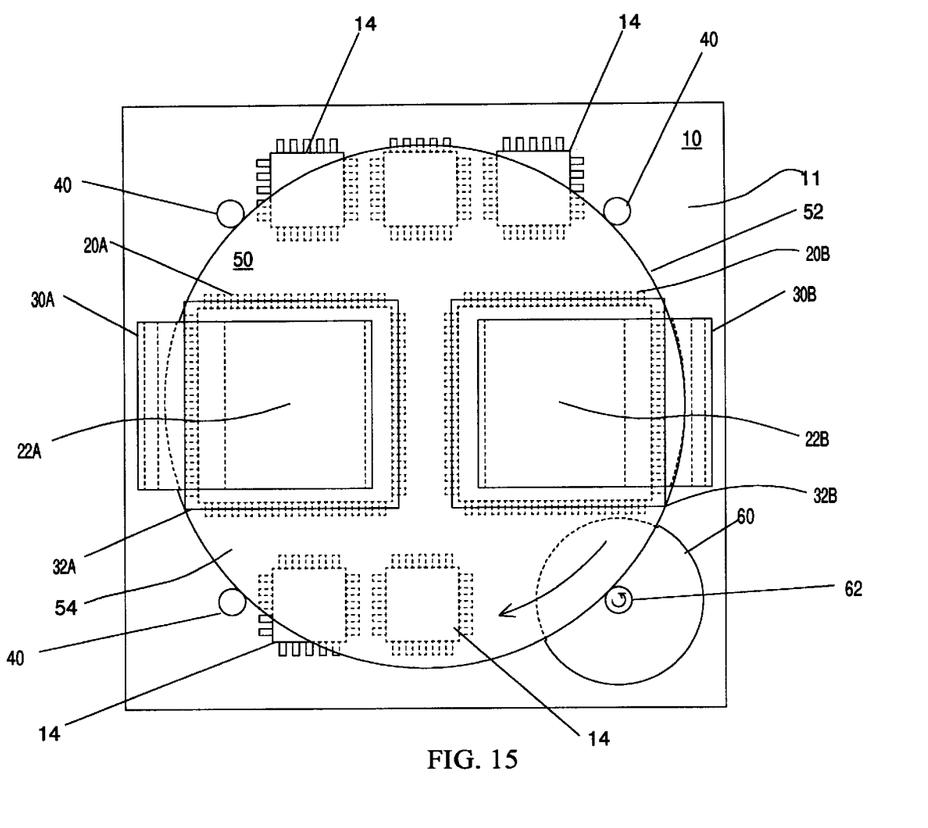
FIG. 15 is a top view of a multiple device application of the rotating disk system in accordance with the present invention.

In FIG. 15 illustrates the use of the rotating disk heat transfer system previously described cooling two modules 20A and 20B having respective surfaces 22A and 22B in contact with the lower surface of disk 50. Spring clips 30A and 30B as shown. The number of modules can be more than two, being limited in part by the size of the disk.

Figure 16:
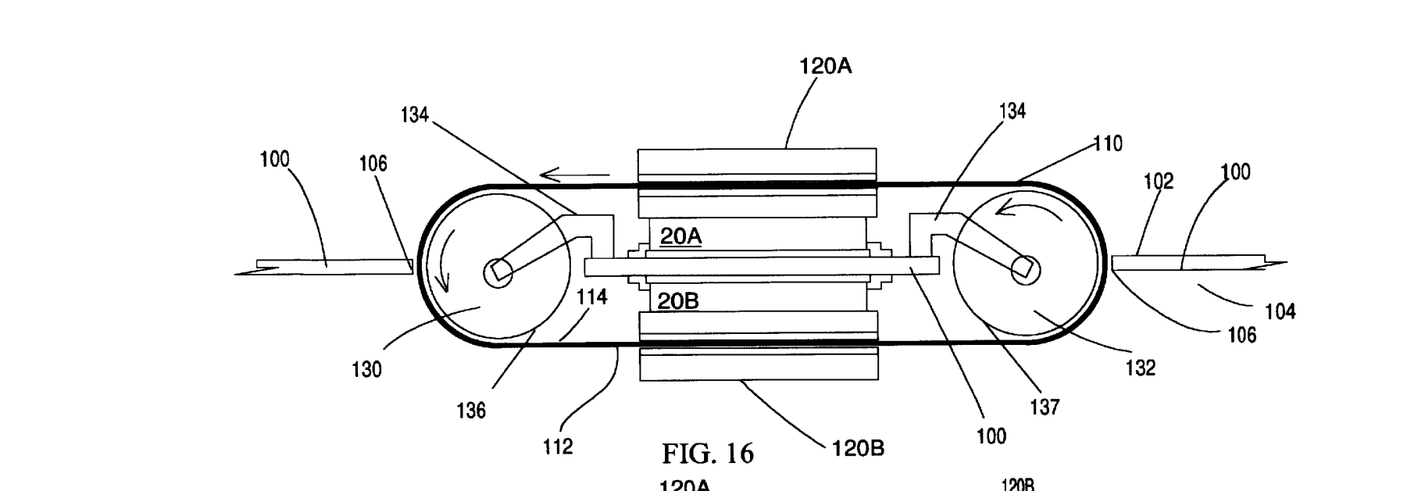
FIG. 16 is a side view of a multiple device application of the continuous belt system in accordance with the present invention.
Figure 17:
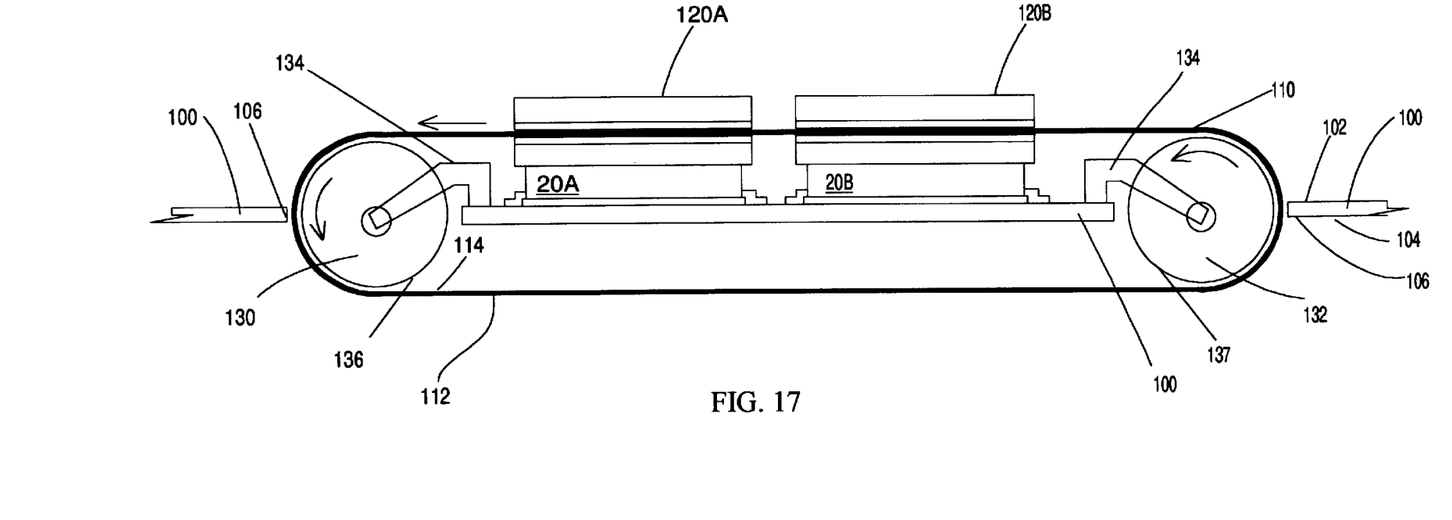
FIG. 17 is a side view of another multiple device application of the continuous belt system in accordance with the present invention.

FIG. 16 illustrates the use of the moving belt heat transfer system previously described with two modules 20A and 20B in contact with belt 110 being held in place by guides 120A and 120B. The modules have been mounted on opposite sides of board 100. FIG. 17 shows an arrangement where the modules 20A and 20B are mounted on the same side of the board. In both of these cases the number of modules can be more than two, being limited in part by the length and width of the belt.

When two or more modules are cooled by the same moving heat sink, an additional benefit is that those modules will be kept at more nearly the same temperature than if cooled by individual heat sinks. As temperature can effect semiconductor devices drastically there exist useful applications where it would be desirable to have two or more devices at the same temperature, say for example to match performance, by running both at the same speed. Motion of the belt or disk could be adjusted by temperature sensors in each device, for example, turning the movement of the belt or disk on after the module reaches a first preset temperature, and then off, when the module reaches a second present temperature.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A heat transfer system for cooling an electronic device having an outer surface comprising:
 a heat transfer element having a first surface, said first surface having an area larger than the outer surface of the electronic device;
 a first means for pressing a portion of said first surface of heat transfer element in thermal contact with the outer surface of the electronic device; and
 a second means for moving the heat transfer element relative to the outer surface of the electronic device so as to continuously bring different portions of the first surface of the heat transfer element in slipping contact with the outer surface of the electronic device.

2. The system of claim 1 wherein the second means imparts rotational motion.

3. The system of claim 1 wherein the heat transfer element is in the form of a disk.

4. The system of claim 3 wherein the heat transfer element is comprises metal, plastic or rubber.

5. The system of claim 1 wherein the second means imparts linear translational motion.

6. The system of claim 5 wherein the heat transfer element is in the form of a continuous belt.

7. The system of claim 6 includes a belt guide having a first surface in slipping contact with one surface of said belt and a second surface in contact with the outer surface of the electronic device.

8. The system of claim 1 wherein said second means imparts reciprocating translational motion.

9. The system of claim 8 wherein the heat transfer element is in the form of a strip.

10. The system of claim 1 wherein the first means comprises a spring pressing against a pressure plate wherein the surface of the plate is in slipping contact with a portion of the heat transfer element which is in contact with the outer surface of the electronic device.

11. The system of claim 1 wherein the first means comprises a roller pressing against a portion of the heat transfer element which is in contact with the outer surface of the electronic device.

12. The system of claim 11 wherein the rollers are segmented into individually rotatable disks.

13. The system of claim 1 includes a third means for controlling the speed of motion of the heat transfer element based on cooling requirements of the electronic device.

14. A method of dissipating heat from an electronic device having an outer surface comprising:
 pressing a portion of at least one surface of a heat transfer element which is larger than the outer surface of the electronic device, against the outer surface of the electronic device in slipping contact; and
 moving the heat transfer element relative to the outer surface of the electronic device so as to continuously bring different portions of the surface of the heat transfer element in slipping contact with the outer surface of the electronic device.

15. The method of claim 14 wherein the heat transfer element is in the form of a rotatable disk.

16. The method of claim 14 wherein the heat transfer element has a high thermal conductivity between 0.1 and 50 W/m° C.

17. The method of claim 14 wherein the heat transfer element is in the form of a continuous belt moveable in a linear direction.

18. The method of claim 14 wherein the heat transfer element is in the form of a strip capable of reciprocating motion in a linear direction.

19. The method of claim 14 further comprising controlling the speed of moving the heat transfer element relative to the electronic device such that the speed is based on cooling requirements of the electronic device.

20. A method of keeping a plurality of electronic devices at a reduced operating temperature, each device having an outer surface comprising;
 pressing a portion of one surface which is larger than the combined outer surfaces of said plurality of electronic devices of a moveable heat transfer element against each outer surface of the plurality of electronic devices in slipping contact so as to be able to continuously bring different portions of the surface of the heat transfer element into slipping contact with each outer surface of the plurality of electronic devices; and
 moving the heat transfer element until the temperature of each of the plurality of devices reaches a first preset limit, at which time the movement of the heat transfer element is stopped, and later resuming movement of the heat transfer element when the temperature difference between any of the plurality of devices exceeds a second preset limit.

21. The method of claim 20 wherein the heat transfer element is in the form of a rotatable disk.

22. The method of claim 20 wherein the heat transfer element comprises metal, plastic or rubber.

23. The method of claim 20 wherein the heat transfer element is in the form a continuous belt moveable in a linear direction.

24. The method of claim 20 wherein the heat transfer element is in the form of a strip capable of reciprocating motion in a linear direction.

* * * * *